(12) United States Patent
Ren et al.

(10) Patent No.: US 8,123,855 B2
(45) Date of Patent: Feb. 28, 2012

(54) DEVICE AND PROCESS FOR GROWING GA-DOPED SINGLE SILICON CRYSTALS SUITABLE FOR MAKING SOLAR CELLS

(76) Inventors: Bing Yan Ren, Tianjin (CN); Li Ren, Tianjin (CN)

( * ) Notice: Subject to any disclaimer, the term of this patent is extended or adjusted under 35 U.S.C. 154(b) by 58 days.

(21) Appl. No.: 12/168,891

(22) Filed: Jul. 8, 2008

(65) Prior Publication Data

US 2009/0072202 A1 Mar. 19, 2009

(30) Foreign Application Priority Data

Jul. 15, 2007 (CN) .............................. 200710058315

(51) Int. Cl.
*C30B 15/00* (2006.01)

(52) U.S. Cl. ................ 117/19; 117/11; 117/13; 117/30; 117/34

(58) Field of Classification Search .................... 117/11, 117/13, 19, 30, 34

See application file for complete search history.

(56) References Cited

U.S. PATENT DOCUMENTS

| | | | | |
|---|---|---|---|---|
| 5,567,399 | A * | 10/1996 | Von Ammon et al. | 422/245.1 |
| 5,814,148 | A * | 9/1998 | Kim et al. | 117/13 |
| 5,993,539 | A * | 11/1999 | Izumi | 117/13 |
| 6,261,364 | B1 * | 7/2001 | Arai et al. | 117/213 |
| 6,348,095 | B1 * | 2/2002 | Watanabe et al. | 117/13 |
| 6,506,251 | B1 * | 1/2003 | Kitagawa et al. | 117/13 |
| 6,815,605 | B1 * | 11/2004 | Abe et al. | 136/261 |
| 6,843,847 | B1 * | 1/2005 | Iida et al. | 117/13 |
| 2003/0209186 | A1 * | 11/2003 | Haga et al. | 117/13 |
| 2004/0083947 | A1 * | 5/2004 | Weber et al. | 117/19 |

* cited by examiner

*Primary Examiner* — Matthew Song
(74) *Attorney, Agent, or Firm* — George G. Wang; Bei & Ocean

(57) ABSTRACT

A device and method for producing Ga doped silicone single crystal with a diameter between 150 and 165 mm and a narrow resistivity distribution range (from 3 Ω·cm to 0.5 Ω·cm). The device is characterized by the use of a shorter heater and a funnel shaped gas flow guide capable of blowing an inert gas such as Ar straight to the crystallization frontier at the interface between outer surface of the nascent single crystal ingot and the surface of the melt of polycrystalline silicone raw materials in a quartz crucible.

6 Claims, 9 Drawing Sheets

DEVICE AND PROCESS FOR GROWING GA-DOPED SINGLE SILICON CRYSTALS SUITABLE FOR MAKING SOLAR CELLS

CROSS REFERENCE TO RELATED APPLICATIONS

This application claims priority to Chinese Patent Application No. 200710058315.1, filed Jul. 15, 2007, the contents of which are hereby incorporated by reference.

FIELD OF THE INVENTION

This invention relates to a technique for manufacturing large diameter single silicon crystal doped with Ga using a CZ method (or pulling method) and more particularly, it relates to a device and process for growing silicon single crystal doped with Ga which has a resistivity distribution range sufficiently narrow to meet the requirement for fabricating silicon crystal solar cells.

BACKGROUND OF THE INVENTION

There are a number of domestic and foreign reported studies about resistivity distribution and characteristics of the silicon single crystal doped with Ga. For example, Pei, Su Hua et al. have disclosed a diffusion model and distribution principle of Ga in $SiO_2$/Si system (see *Rare Metals and Material Engineering* 2005, 6, pages 920-923). They studied diffusion characteristics of Ga in $SiO_2$/Si system and surface and particle distribution of Ga. A production process of the silicon single crystal doped with Ga was also disclosed in Japan by Abe Takao for improving resistivity distribution of silicon single crystal doped with Ga in the pulling direction and for producing silicon single crystal with more uniform resistivity. Accordingly, a method for producing silicon single crystal doped with Ga based on the CZ method was proposed in the disclosure, which called for a reduction in atmosphere pressure during growth of the silicon single crystal (see *Method For Producing Ga-Doped Silicon Single Crystal*, JP2002154896, 2002-05-28).

The major difficulty encountered by the pulling method (also known as the Czochralski method or CZ method) is a large resistivity difference produced between the head portion and the tail portion of the Ga-doped silicon single crystal made according to a conventional CZ pulling method. This is due to the very low segregation coefficient of Ga in Silicon (e.g. $k_0$=0.08, while segregation coefficient of Boron in Silicon is 0.8). The ratio of resistivity of head portion to that of tail portion sometimes may reach 50-60 and therefore only a small portion of the silicon single crystal ingots produced can be utilized in solar cells.

U.S. Pat. No. 6,815,605 disclosed a method of producing silicon single crystal doped with Ga, which was aimed to solve the problem of photo-degradation in the silicone single crystal having a high oxygen concentration. However, the ingot produced by the method has a resistivity range between 5Ω·cm and 0.1Ω·cm, a 50 time difference.

SUMMARY OF THE INVENTION

One object of the present invention is to provide a device used for growing a silicon single crystal doped with Ga using a pulling method. Comparing with prior art devices, the device of the present invention is characterized in (a) having a shorter Φ16" heater with an effective heating height between 300 mm and 375 mm while it is between 400 mm and 450 mm in the prior art and (b) having a funnel-shaped gas flow guide for directing an inert gas flowing directly towards the interface between the nascent crystal ingot and the melt of polycrystalline silicone raw material. The rim of the lower opening of the gas flow guide is positioned about less than 30 mm, preferably less than 25 mm, above the surface of the melt. By comparison, conventional methods all position the lower opening rim of the gas guide at least 45 mm above the surface of the melt. In addition, the present invention calls for the use of a Ga preparation with a 99.999999% purity, and direct burring of the Ga preparation into the polycrystalline silicon raw material during the charging process for proper doping without the need for preparing dopant in advance, hence simplifying the procedure, lowering production costs and enabling large scale industrial productions.

The shorter heater of the present invention offers the following advantages: First, the longitudinal temperature gradient of the melt is reduced effectively, which helps minimize the thermal convection within the melt. As a result, fewer impurities will come off from the inner wall of the quartz crucible into the melt due to the thermal convection. Second, the reduced longitudinal temperature gradient helps keep the melt calm, thereby creating such a physical condition at the crystallization frontier that is conducive to rapid crystallization. Third, the reduced longitudinal temperature gradient and thermal convention help reduce Ga segregation and ensure high doping rate and crystallization speed.

The use of a funnel-shaped gas flow guide also has the following advantages: First, the funnel shaped guide assists in directing the inert gas flow (such as Ar) from the top of the furnace effectively towards the nascent silicone single crystal ingot just coming out of the melt, thereby properly increasing the cooling rate and thermal gradient of the silicone single crystal ingot. This increases the growth rate of the ingot. Second, the funnel shaped gas flow guide can deliver the inert gas straight to the crystallization frontier where the outer surface of the nascent ingot interfaces with the surface of the melt. This speeds up the crystallization and shortens the ingot production cycle. No prior art method can achieve such accurate straight gas delivery. Third, the straight gas delivery to the crystallization frontier can reduce Ga segregation and ensure Ga integration in the ingot from the melt of the raw materials. This in turn reduces the difference of resistivity between the head portion and the tail portion of the ingot.

Another object of the present invention is to provide a method of fabricating large diameter silicon single crystals doped with Ga. The method is based on the CZ method, producing a Ga doped silicon single crystal having a diameter between 150 mm-165 mm and small resistivity deference between the head portion and tail portion suitable for being used in solar cells. The resistivity range of the silicon single crystal produced according to the present invention is between 3 Ω·cm-0.5 Ω·cm. Such result cannot be achieved by conventional pulling methods. By comparing with the prior art methods, the method according to the present invention is characterized by (a) using a higher inert gas flow rate in the heating chamber before melting the polycrystalline silicon raw material (for example, the Ar flow rate is adjusted to 20-35 L/h, which is about twice as high as conventionally used), and (b) using a slower rotation speed of the quartz crucible during the melting process of the raw material (the rotation speed is adjusted to 1-2 rpm while it is 3-5 rpm in prior art methods). These novel production conditions help reduce the resistivity difference between the head portion and the tail portion of arge diameter Ga doped silicon single crystals.

The various features of novelty which characterize the invention are pointed out with particularity in the claims annexed to and forming a part of this disclosure. For a better understanding of the invention, its operating advantages, and specific objects attained by its use, reference should be made to the drawings and the following description in which there are illustrated and described preferred embodiments of the invention.

DETAILED DESCRIPTION OF PARTICULAR EMBODIMENTS

The Heating Device

Figure 1:
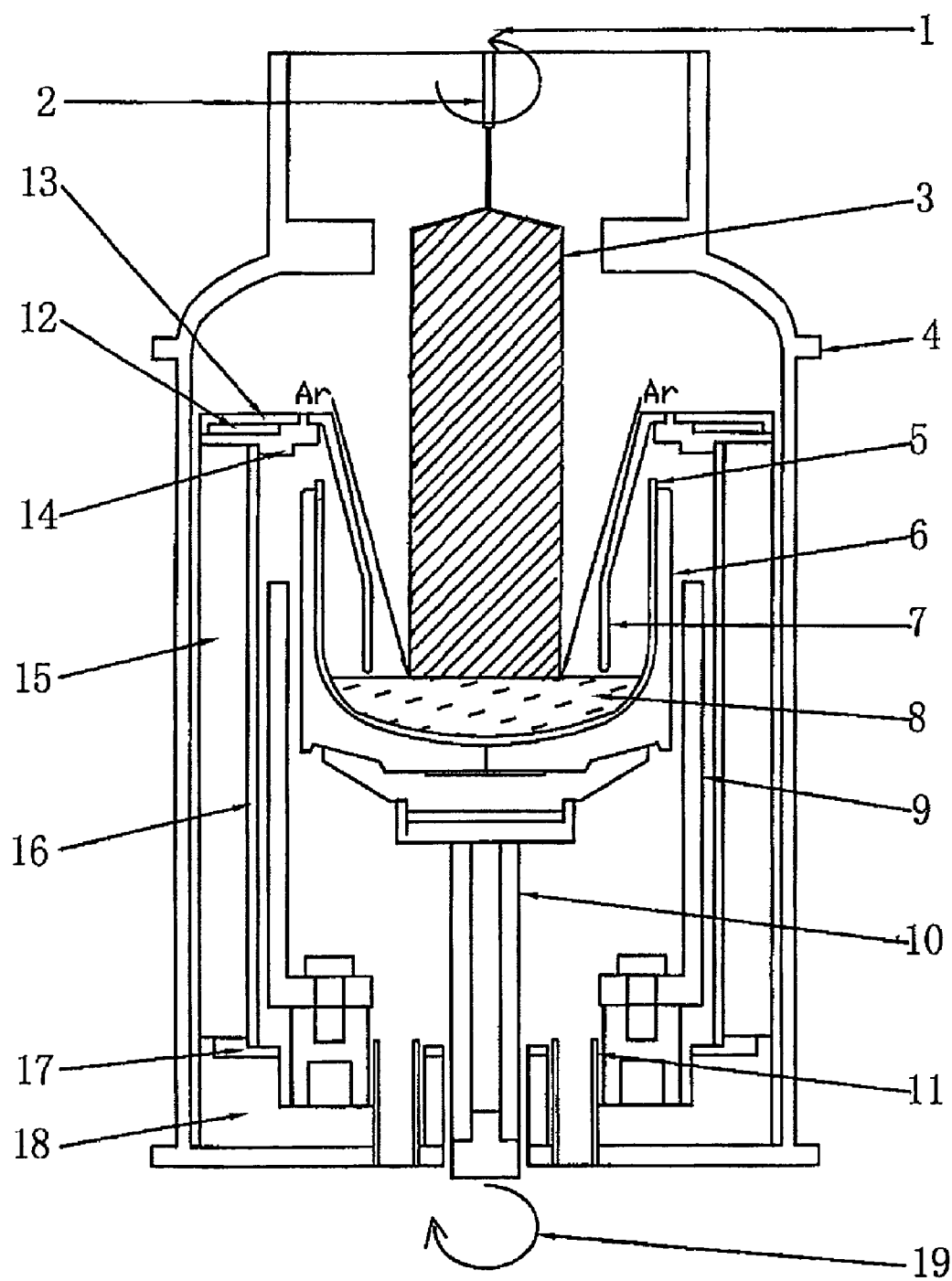
FIG. 1 is a schematic cross sectional view of a device for growing Ga doped silicon single crystal according to the present invention.
Figure 7:
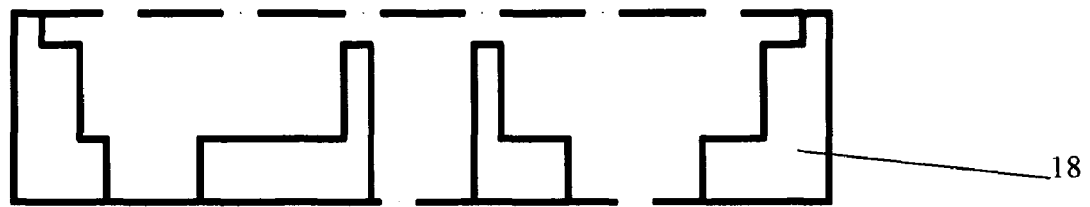
FIG. 7 shows a bottom tray supporting the heater according to the present invention.

FIG. 1 depicts an exemplary heating device, of a furnace type, according to the resent invention, and it includes outer enclosure 4, quartz crucible 5, graphite crucible 6, multi-layered gas flow guide 7, heater 9, a shaft 10 supporting the graphite crucible, gas outlets 11, insulation carbon felt 12 and 15, insulation lid 13, upper position tray 14, lower position tray 17, graphite heat insulation tube 16 (which is about 15 mm distanced from the outer surface of the heater's sidewall), bottom tray 18 (see also FIG. 7). FIG. 1 also shows the heating device in operation, where there is a nascent silicon single crystal 3 growing out of the melt 8, and arrows 1 and 19 indicate that the nascent silicon single crystal ingot and the crucibles are rotating in the opposite directions.

Figure 2:
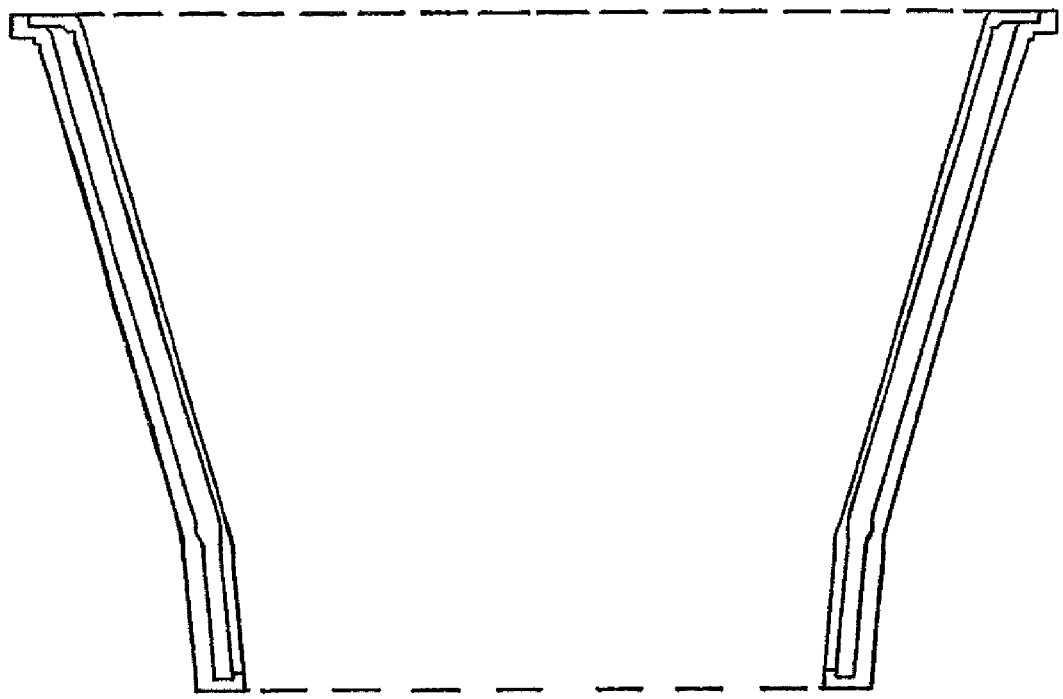
FIG. 2 is a schematic cross sectional view of a gas flow guide according to the present invention.
Figure 6:
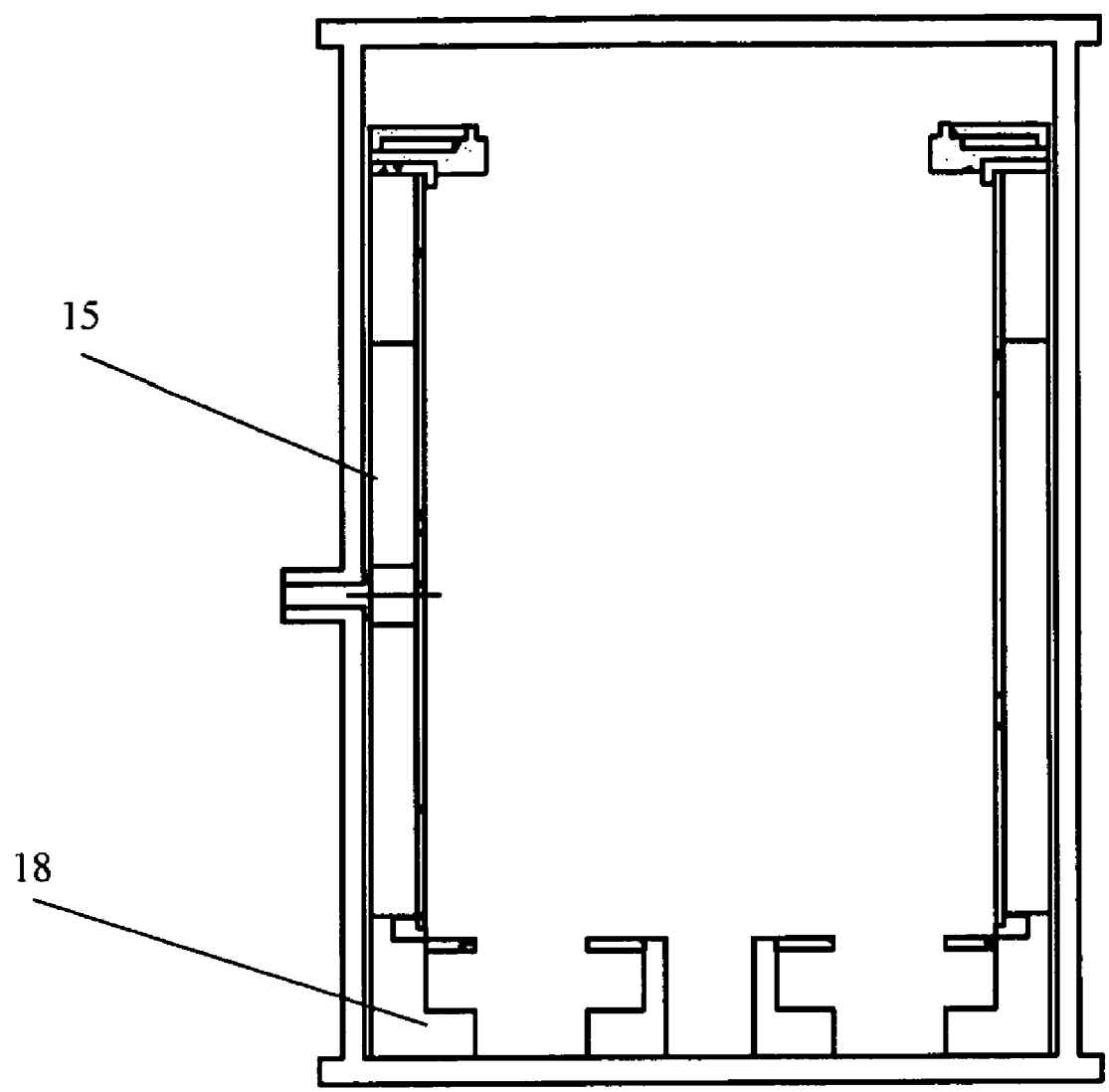
FIG. 6 shows a heat insulation part installed in the heating device according to the present invention.

The inner diameter of the chamber of the furnace or heating device is 620~700 mm. The quartz crucible sits in the graphite crucible with the upper rim of the quartz crucible being configured to be 20 mm (or in the range between 20 and 25 mm) higher than the rim of the graphite crucible. The heater is mounted in the chamber of the furnace. Outside the heater, there is a graphite heat insulation tube. A carbon felt insulation layer is further installed on the outside of the heat insulation tube (see also FIG. 6). The heat insulation tube is secured between the in the upper position tray and the lower position tray. The gas flow guide is of a funnel shape for more effectively delivering the inert gas to the crystallization frontier. It has a trapezoidal section and a cylindrical section (as more clearly shown in FIG. 2). The upper opening rim of the guide and the insulation lid are all secured on the upper position tray made of graphite. In addition to supporting the crucibles, the shaft is also responsible for rotating and moving up and down the crucibles as coordinated by a controller of the device during the single crystal growing process.

Figure 3:
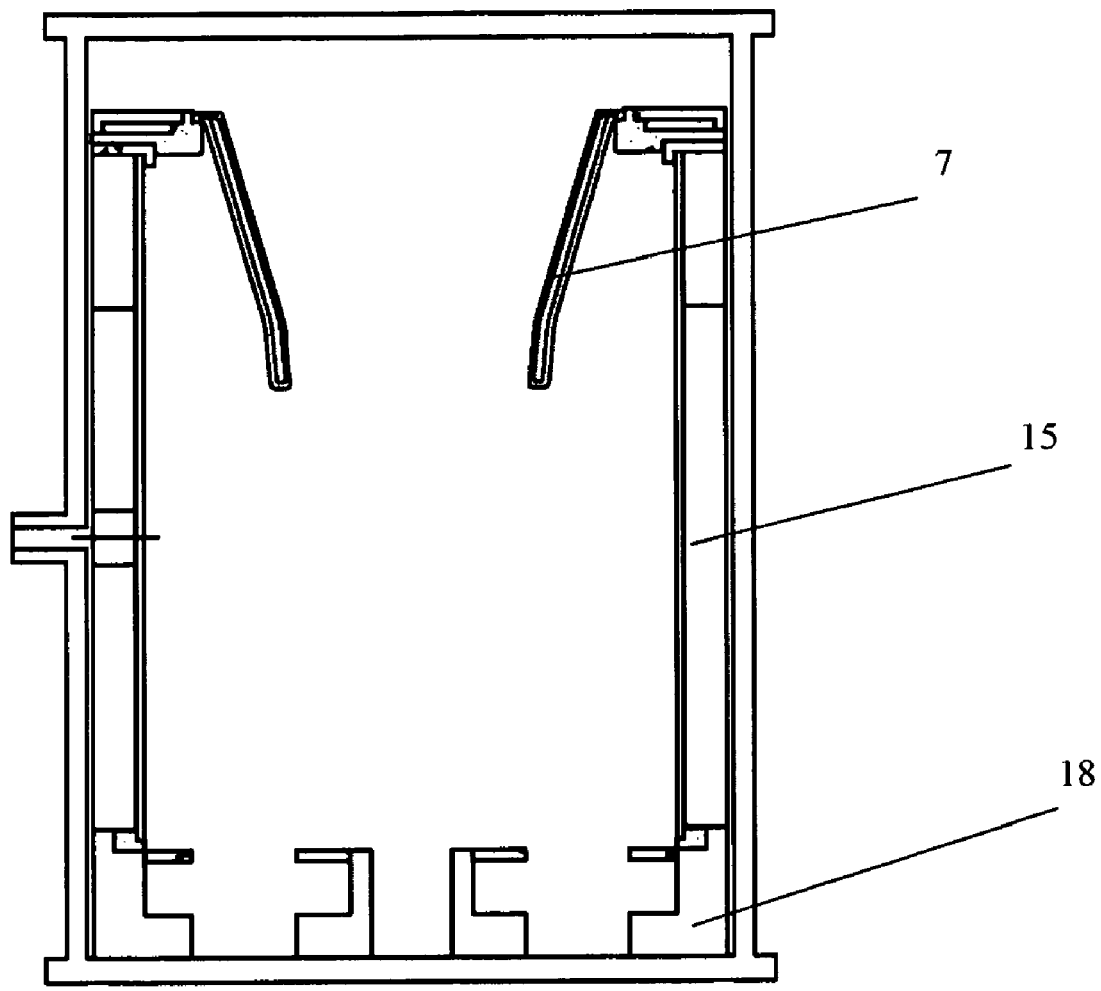
FIG. 3 shows the same gas flow guide of FIG. 2 after installed in the heating device according the present invention.

FIG. 3 shows the way that the gas flow guide is configured inside the furnace according to the present invention. The effective height of the heater is 330~375 mm while its total height is 480 mm.

Figure 4:
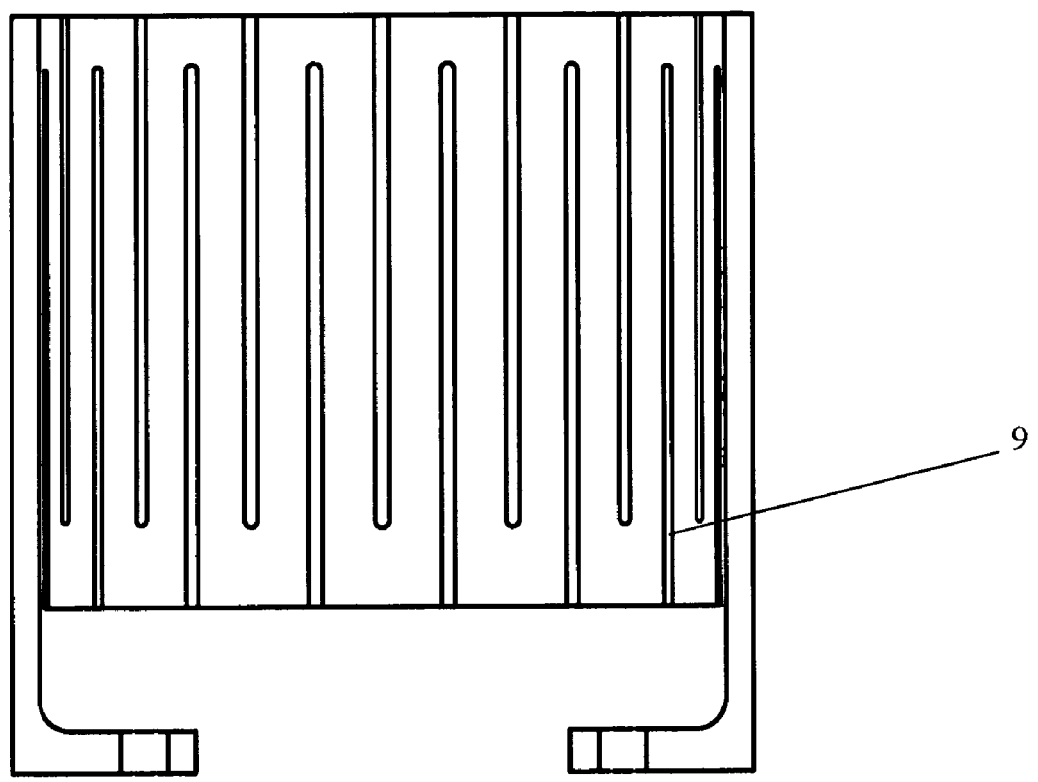
FIG. 4 is a schematic view of a heater of the device according to the present invention.
Figure 8:
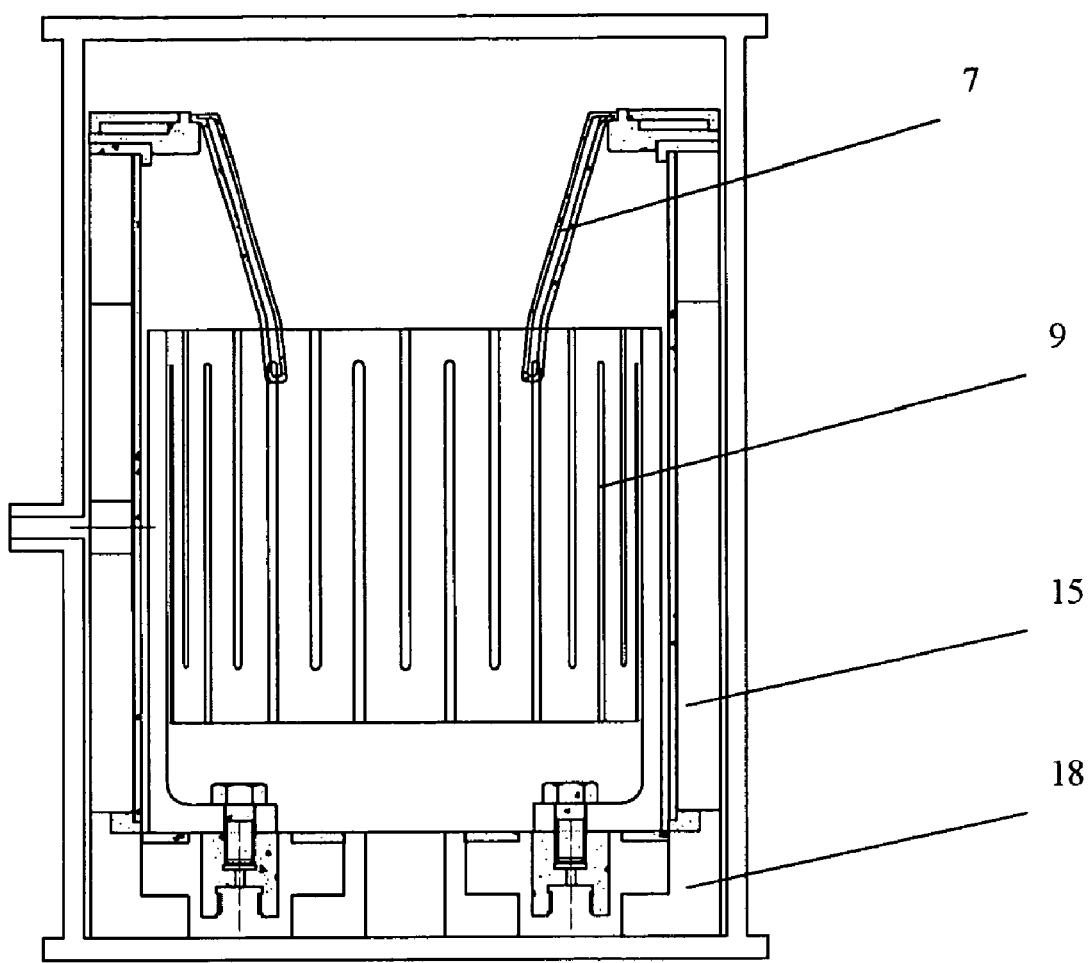
FIG. 8 shows the same heater of FIG. 4 as installed in the heating device according to the present invention.

FIG. 4 shows more details of the heater. It has 32 equal sections, and because the electrode sections are seamless, it appears to have 30 sections. The section divider is 10 mm wide and 285 mm high. The outer diameter of the heater is 495 mm, and the inner diameter is 458 mm. The distance between the holes of the electrodes is 320 mm. FIG. 8 shows the way that the heater along with the gas flow guide is configured inside the furnace.

The Process of Producing Large Diameter Single Silicon Crystal

Figure 5:
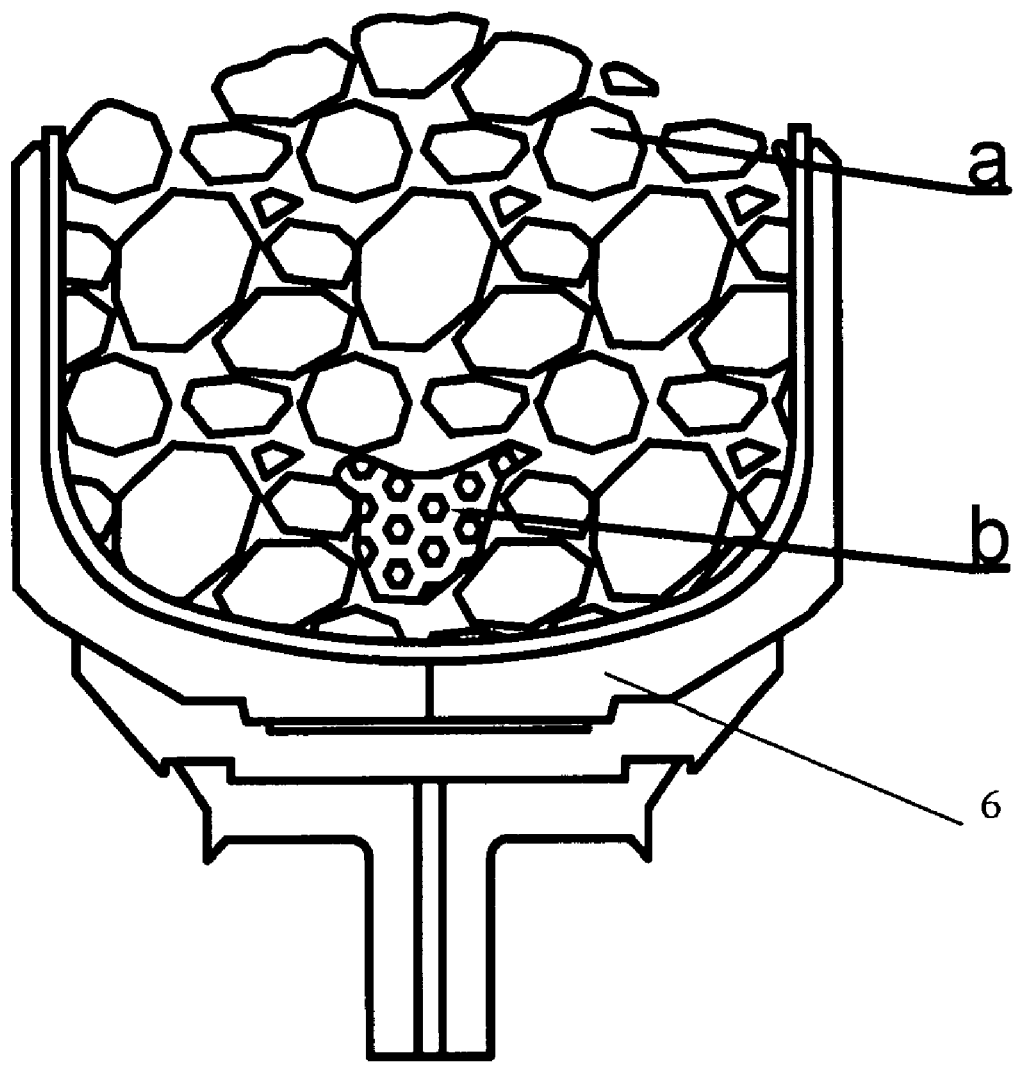
FIG. 5 is a schematic cross-sectional view of a quartz crucible disposed inside a graphite crucible.

Step 1: Preparation:

The furnace is cleaned up and evacuated to a vacuum condition to ensure there is no malfunction. Then the furnace is opened and the polycrystalline silicon raw material (42 Kg) is loaded into the crucible and Ga (1.6 g, 99.9999% pure), shown as "b" in FIG. 5, is then added at the central of the polycrystalline silicon raw material, shown as "a" in FIG. 5. The furnace is then filled with Ar until the pressure reaches 2000 Pa (but it can be in the 1900-2000 Pa range). The Ar flow rate is within the range of 20-35 L/hour, which is twice as fast as used in conventional methods.

Step 2: Melting Raw Material:

With the crucible being positioned at a lower level with no rotation, the heater is turned on to melt the raw material. After the raw material starts being melted, the rotational speed of the crucible is adjusted to 1-2 rpm to complete the melting step. The temperature of the melt is controlled at 1500° C., but is acceptable if it is within the range of 1420° C.~1500° C. The melting point of silicon is 1420° C.

Step 3: Forming the Neck Portion:

The lower opening rim of the gas flow guide is positioned at a distance of 25 mm (or within the range of 15-25 mm) above the surface of the melt, which is a distance much shorter than 45 mm used in the prior art. The temperature is decreased until some "over-cooling" is observed at the surface of the melt and the temperature is maintained unchanged for 30 minutes. A seed crystal is lowered until it is 90 mm above the surface of the melt and is preheated there for about 30 minutes. The rotational speed of the seed crystal is then set to 7 rpm (or in the range of 5-8 rpm), and the seed crystal is further lowered and immersed in the melt for 30 minutes (or in the range of 30-35 minutes). Pulling is then performed at a speed of 5.5 mm/minute (or in the range between 1.5 and 6.5 mm/minute) to form the neck portion with a diameter in the range between 2 mm and 3 mm and a length greater than 160 mm.

Step 4: Forming the Shoulder Portion:

The pulling action continues to form a shoulder portion (or a cone portion) at a speed 2.4 mm/minute (or in the range between 1.6 and 2.6 mm/minute). When the shoulder portion is half-way complete, the pulling speed is adjusted to 1.2 mm/minute.

Step 5: Forming Ingot Main Body (with a constant diameter)

When the diameter of the shoulder portion grows to a predetermined value, formation of a constant diameter portion (i.e., the main body) of the single crystal is started. The pressure inside the furnace chamber is controlled to be constant at 2500 Pa. The flow rate of Ar is 25 L/minute. The pulling speed is 0.9 mm/minute. The nascent ingot is rotating at 6-30 rpm while the crucible is rotating in the opposite direction at 5-10 rpm for growing a constant diameter main body. The height of the crucible is adjusted so that the lower opening rim of the gas flow guide is kept at 15 mm from the surface of the melt in the crucible. When the main body grows to a predetermined length (for example 650 mm), a tail portion is formed by decreasing the diameter of the ingot, which is cut off from the surface of the raw material melt to complete the crystal growing process.

The diameter of the single crystal ingot can be controlled by adjusting various parameters during the growing process, which is well within ordinary skill of an artisan in the field.

Measurement of Resistivity of Ga Doped Single Silicone Crystal

Figure 9:
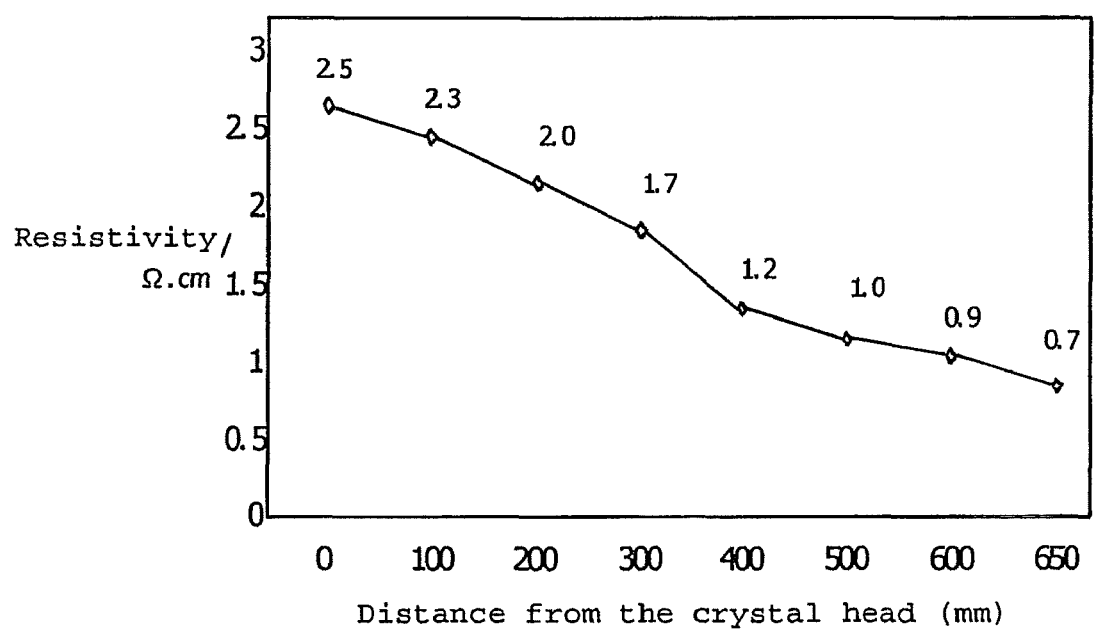
FIG. 9 shows the resistivity distribution of a silicon single crystal produced according to the present invention.

A Ga doped silicone single crystal was made according to the present invention as described in the foregoing and was tested about its resistivity distribution along the longitudinal direction (i.e., from the head to the tail). The crystal measured 150 mm in diameter and 650 mm in length. Resistivity was determined by an SDY-3 resistivity measuring device made by the Institute of Guangzhou Semiconductor and according to the specification of GB/T11553-1997 standard. The result is presented in FIG. 9, which shows that the resistivity decreases from the head portion (less than 3) to the tail portion (greater than 0.5). The resistivity difference from the head to the tail is less than 6 times and thus it fully satisfies the requirement for being used in solar cells.

While there have been described and pointed out fundamental novel features of the invention as applied to a preferred embodiment thereof, it will be understood that various omissions and substitutions and changes, in the form and details of the embodiments illustrated, may be made by those skilled in the art without departing from the spirit of the invention. The invention is not limited by the embodiments described above which are presented as examples only but can be modified in various ways within the scope of protection defined by the appended patent claims.

What is claimed is:

1. A method of producing a silicon single crystal, comprising the following steps:
    (a) charging the raw polycrystalline silicon with Ga directly embedded in the center thereof in a quartz crucible in a chamber of a heating device;
    (b) filling said chamber with an inert gas at a flow rate between 20-35 L/hour;
    (c) maintaining the pressure within said chamber in the range from 1900 to 2000 Pa;
    (d) melting said raw polycrystalline silicon with Ga embedded therein by heating said quartz crucible to produce a melt,
    (e) positioning a lower opening rim of a gas flow guide at a distance between 5 and 25 mm above the surface of said melt,
    (f) preheating, lowering and immersing a seed crystal into said melt; and
    (g) pulling said seed crystal from said melt to produce a silicon single crystal comprising a neck portion, a shoulder portion and a main body.

2. The method according to claim 1, wherein in step (c) said pressure is maintained at 2000 Pa.

3. The method according to claim 1, wherein step (f) proceeds in two stages:
    (fa) lowering said seed crystal at a position 90 mm above the surface of said melt to preheat it at said position for about 30 minutes; and
    (fb) lowering said seed crystal into said melt and keep it in said melt for about 30 minutes with said seed crystal being rotating at a rate of about 7 rpm.

4. The method according to claim 1, wherein step (g) proceeds in three stages:
    (ga) forming a neck portion with a pulling speed set at 5.5 mm/minute;
    (gb) forming a shoulder portion with a pulling speed changing from 2.4 mm/minute to 1.2 mm/minute; and
    (gc) increasing pressure in said chamber to 2500 Pa and forming a main body with a constant diameter, a pulling speed set at 0.9 mm/minute, a inert gas flow rate set at 25 L/hour, a rotation speed of said seed crystal set at 6-30 rpm, a rotation speed of said quartz crucible set at 10 rpm, and the distance between said lower opening rim of said gas flow guide and the surface of said melt maintained at 15 mm.

5. The method according to claim 4, wherein said inert gas is Ar.

6. The method according to claim 5, wherein said main body has a diameter in the range between 150 mm and 165 mm.

* * * * *